(12) United States Patent
Mahanpour et al.

(10) Patent No.: US 6,991,946 B1
(45) Date of Patent: Jan. 31, 2006

(54) METHOD AND SYSTEM FOR PROVIDING BACKSIDE VOLTAGE CONTRAST FOR SILICON ON INSULATOR DEVICES

(75) Inventors: Mehrdad Mahanpour, Union City, CA (US); Mohammad Massodi, Los Altos, CA (US); Caiwen Yuan, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 61 days.

(21) Appl. No.: 10/701,877

(22) Filed: Nov. 5, 2003

(51) Int. Cl.
*H01L 21/66* (2006.01)

(52) U.S. Cl. .............................. 438/14; 438/16; 438/17; 438/151

(58) Field of Classification Search .................. 438/10, 438/11, 14, 15, 16, 17, 18, 151, 154
See application file for complete search history.

(56) References Cited

U.S. PATENT DOCUMENTS

| | | | | |
|---|---|---|---|---|
| 6,201,240 B1 * | 3/2001 | Dotan et al. | ................. | 250/310 |
| 6,236,222 B1 * | 5/2001 | Sur et al. | .................... | 324/758 |
| 6,300,147 B1 * | 10/2001 | Naruoka | ....................... | 438/14 |
| 6,451,668 B1 * | 9/2002 | Neumeier et al. | .......... | 438/456 |
| 6,521,512 B2 * | 2/2003 | Vasquez | .................... | 438/459 |
| 6,770,495 B1 * | 8/2004 | Ang et al. | .................... | 438/14 |

* cited by examiner

*Primary Examiner*—Kevin M. Picardat
(74) *Attorney, Agent, or Firm*—Winstead Sechrest & Minick P.C.

(57) ABSTRACT

The present inventive principles provide a method and system for performing backside voltage contrast on an SOI device. The SOI semiconductor device includes a bulk silicon, a box insulator residing on the bulk silicon and a silicon region on the box insulator. The SOI semiconductor device further includes a plurality of structures in the silicon region, the plurality of structures includes a conductive structure. The method and system include mechanical dimpling and chemical etching of the substrate to expose the box insulator. Optionally, a second chemical etch to remove at least a portion of the box insulator may be performed. A charged particle beam, such as energetic electrons from an SEM, for example, may be directed at the backside of the device, and emitted secondary electrons observed.

8 Claims, 8 Drawing Sheets

METHOD AND SYSTEM FOR PROVIDING BACKSIDE VOLTAGE CONTRAST FOR SILICON ON INSULATOR DEVICES

TECHNICAL FIELD

The present invention relates, in general, to semiconductor devices, and more particularly to a method and system for analyzing SOI semiconductor devices using backside voltage contrast.

BACKGROUND INFORMATION

Silicon on insulator (SOI) semiconductor devices are increasingly utilized. A SOI semiconductor device includes a semiconductor substrate, or bulk silicon. On the semiconductor substrate is an insulating layer, typically silicon dioxide. The insulating layer is known as the box layer. On the box layer is a silicon region, termed the body, that is typically p-doped. The source and/or drain junctions, shallow trench isolation (STI) regions, gate stacks, spacers and other structures, are formed on the silicon. Conductive structures, such as interconnects and contacts, electrically connect devices within the SOI semiconductor device. Typically, the contacts are formed of tungsten, while the interconnects are composed of copper.

SOI semiconductor devices may have failures, such as shorts or open circuits, that arise when the semiconductor device is fabricated. Similarly, components of the semiconductor devices may fail during testing and/or operation. As a result, it is desirable to perform failure analysis to determine the type of failure that has occurred, the components affected and the location of the failure. Additionally, analysis of the structural features of the device may provide information on fabrication process parameters and control.

One method analyzing semiconductor devices is passive voltage contrast. In the passive voltage contrast technique, a scanning electron microscope (SEM) may direct an energetic beam of electrons to an integrated circuit or wafer placed on a stage in a vacuum chamber. Upon directing electrons onto the test circuit or wafer, secondary electrons may be produced. This technique has typically be used for detecting defects, such as a gate oxide breakdown from the front side of the device. The secondary electrons may be emitted when there is a conductive path for electrons to flow. Consequently, the image of areas where there is a conductive path may be brighter than the areas in which there is no conductive path. By determining if the area around the gate oxide region is dark or bright, breakdown in gate oxide region may be detected. If the gate oxide has broken down, the area will appear bright since a conductive path has been formed from the gate to the channel. Conversely, a sound gate oxide region will appear dark.

Structures within the body of the device may similarly exhibit such variation in the emission of secondary electrons and the resulting image contrast when illuminated by an energetic charged particle (electron or ion) beam. For example, the secondary emission from p-type regions and n-type regions typically is different. Thus, voltage contrast techniques may be advantageously applied to inspect structures within the semiconductor body. However, an energetic particle beam, such as an SEM beam directed to the topside of the chip cannot penetrate to these structures.

Accordingly, there is a need in the art for techniques for backside voltage contrast inspection of semiconductor devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present inventive principles provide a method and system for performing backside voltage contrast on an SOI device. The SOI semiconductor device includes a bulk silicon, a box insulator residing on the bulk silicon and a silicon region on the box insulator. The SOI semiconductor device further includes a plurality of structures in the silicon region, the plurality of structures includes a conductive structure. The method and system include mechanical dimpling and chemical etching of the substrate to expose the box insulator. Optionally, a second chemical etch to remove at least a portion of the box insulator may be performed. A charged particle beam, such as energetic electrons from an SEM, for example, may be directed at the backside of the device, and emitted secondary electrons observed.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Figure 1:
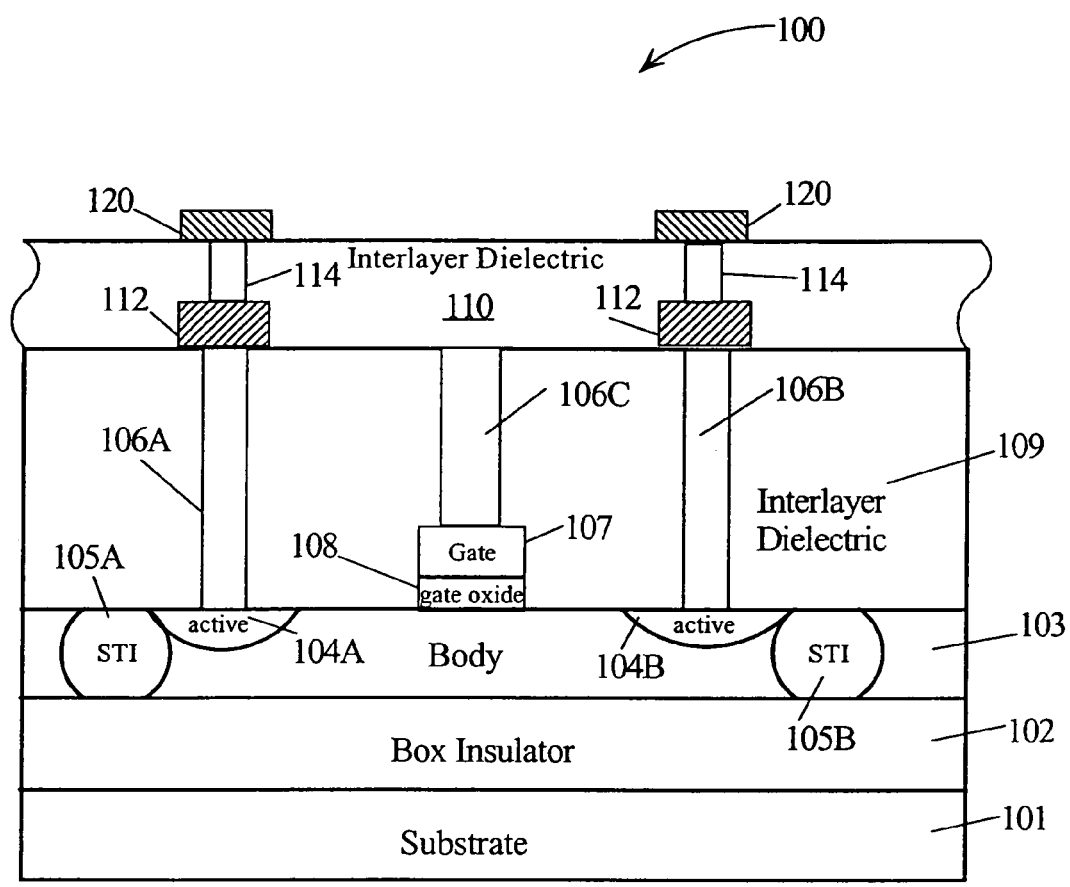
FIG. 1 is a cross-sectional view of a silicon on insulator semiconductor device.

FIG. 1 illustrates an embodiment of a semiconductor on insulator (SOI) semiconductor device 100 which may be used in conjunction with the present invention. SOI device 100 may be formed on bulk silicon substrate 101. SOI device 100 may further include a layer of oxide 102, referred to as the "box insulator," disposed on the bulk silicon 101. In one embodiment, oxide 102 may be composed of $SiO_2$. On top of box insulator 102 may reside a silicon region, referred to as the "body" 103. Body 103 may include active regions 104A–B, e.g., source/drain junctions, and shallow trench isolation (STI) regions 105A–B. Active regions 104A–B may collectively or individually be referred to as active regions 104 or active region 104, respectively. One of ordinary skill in the art would appreciate that active regions 104 may be either p-type regions or n-type regions depending on the type of the device, a PFET or an NFET, respectively. For the purposes herein, FIG. 1 may be used to represent wither type of device in a particular embodiment. STI regions 105A–B may collectively or individually be referred to as STI regions 105 or STI region 105, respectively. Active regions 104A–B may be interconnected to metal-1 layer 112 via contacts 106A–B, respectively. Contacts to external circuitry may be made through metal-2 layer 120. Vias 114 through interlayer dielectric 110 connect metal-1 layer 112 and metal-2 layer 120. Further, the top of SOI device 100 may be interconnected with a polysilicon gate 107 via contact 106C. Contacts 106A–C may collectively or individually be referred to as contacts 106 or contact 106, respectively. In one embodiment, contacts 106 may be comprised of tungsten. Polysilicon gate 107 may be separated from body 103 by a gate oxide 108. Contacts 106, polysilicon gate 107 and gate oxide 108 may be interposed by an interlayer dielectric 109. It is noted that SOI device 100 may comprise any number of contacts 106, active regions 104, STI regions 105, gates 107 and gate oxide regions 108 and that FIG. 1 is illustrative. For example, an alternative embodiment may omit STI regions 105.

The present invention will be described in terms of a particular method having certain steps and particular tools, such as a scanning electron microscope (SEM). However, one of ordinary skill in the art will readily recognize that the present invention will operate effectively for tools having other and/or additional components. In addition, one of ordinary skill in the art will also readily recognize that the methods of the present invention may include other and/or additional steps that, for clarity, are not depicted. The present invention will be described in terms of certain semiconductor devices and certain structures within the semiconductor devices. However, the present invention is consistent with the testing of other semiconductor devices and/or additional or different structures. One of ordinary skill in the art will also readily recognize that for clarity, only certain portions of the semiconductor devices are depicted.

Figure 2:
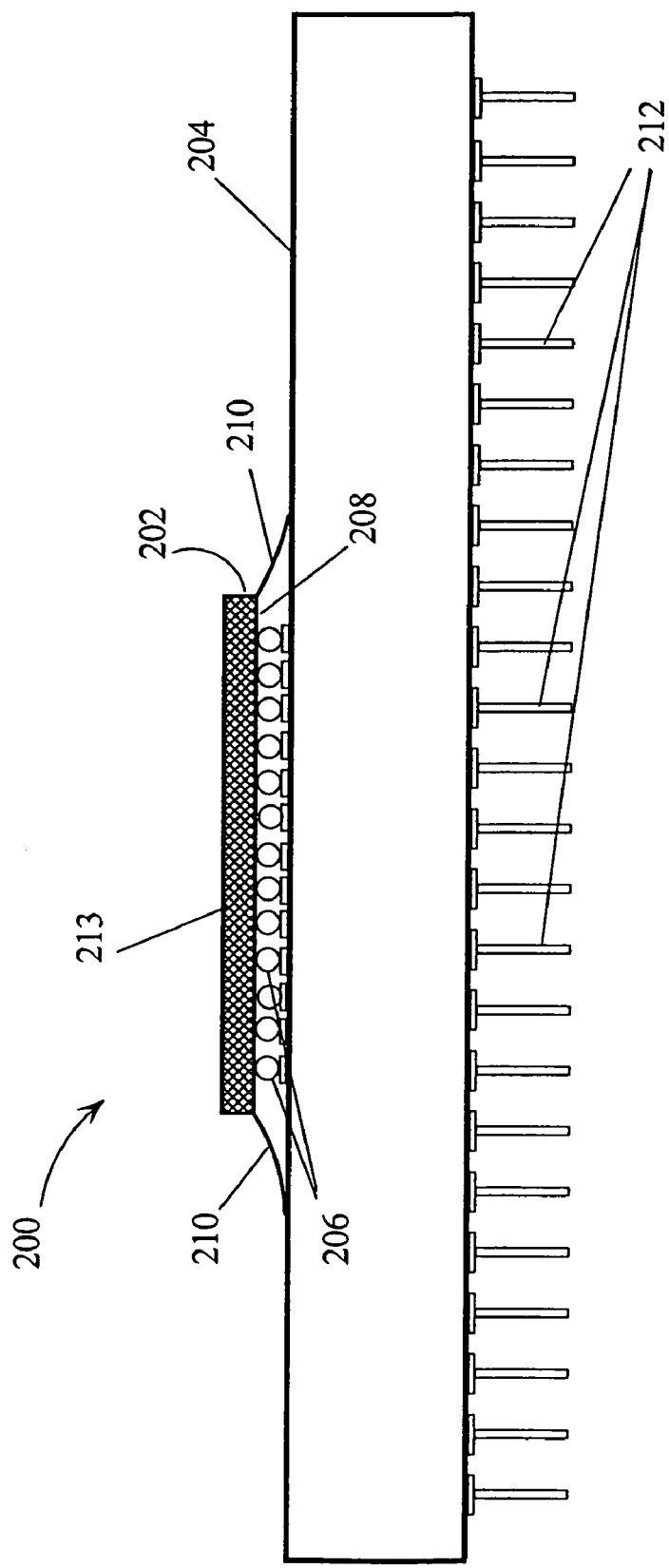
FIG. 2 illustrates a cross-sectional view of a device mounted in a pin-grid array (PGA) package which may be used in conjunction with backside voltage contrast in accordance with the present invention.

Refer now to FIG. 2 illustrating, in cross-sectional view, a "pin-grid" array (PGA) packaged semiconductor device 200 which may be used in conjunction with the methodology for performing backside voltage contrast in accordance with the present inventive principles, and discussed in conjunction with FIG. 3, below.

Integrated circuit (IC) 202 may be a SOI device, such as SOI device 100, FIG. 1. IC 202 is electrically connected to PGA 204 by solder balls 206. The electrical contact may be made to the metal-2 layer (for example, metal-2 layer 120, FIG. 1) at the topside surface 208 of IC 202. Underfill 210, typically an insulating material such as epoxy glue that provides a mechanical bond between IC 202 and PGA 204. Connections to external circuitry (not shown) are provided by an array of pins 212 connected to corresponding ones of solder balls 206. Note that a package cap that would be used in devices packaged for use in applications has been removed, thereby exposing a backside surface 213 of IC 202.

Figure 3:
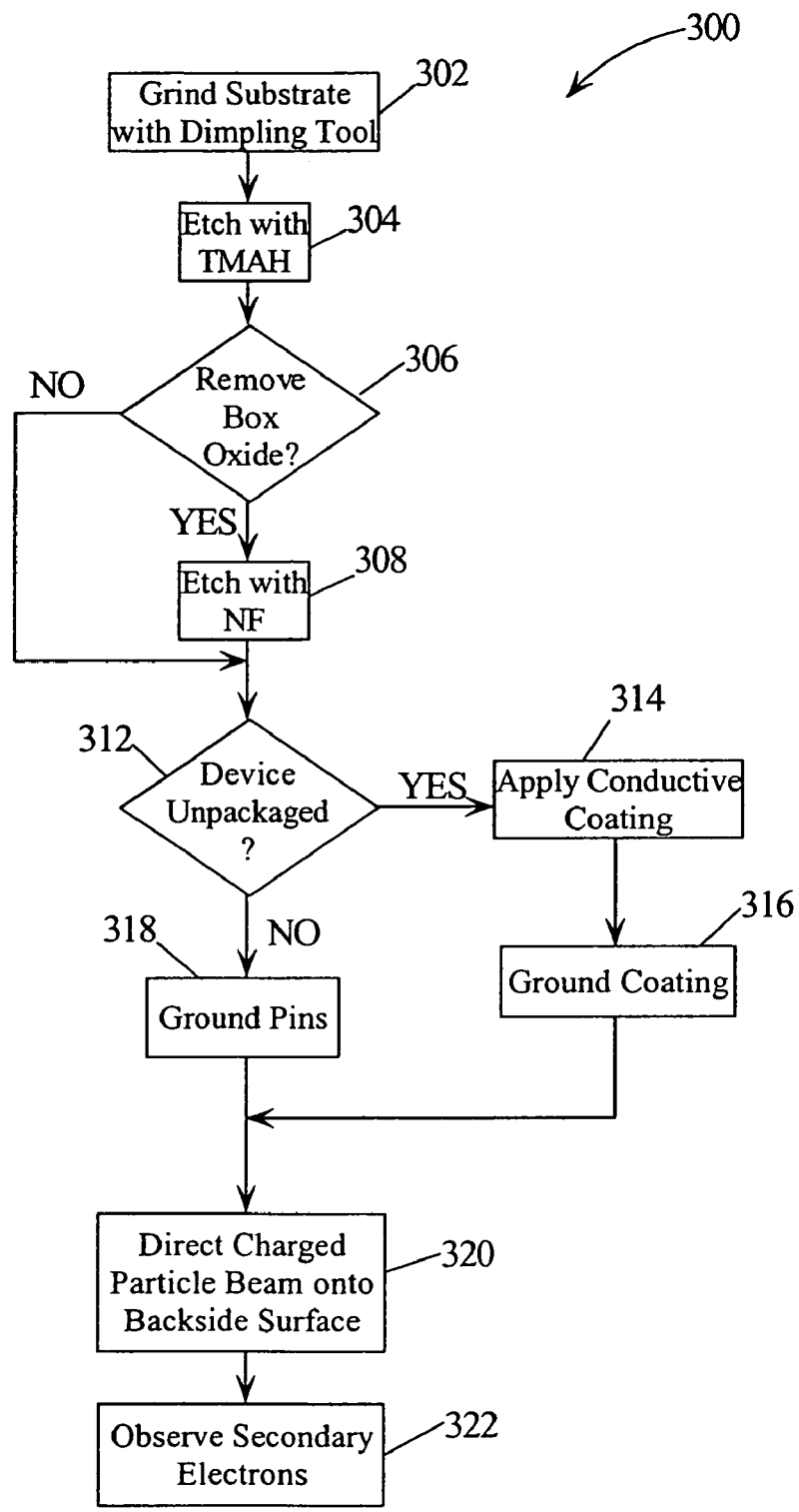
FIG. 3 is a flowchart of a method for performing backside passive voltage contrast on the SOI device in accordance with an embodiment of the present invention.

Refer now to FIG. 3 illustrating in flowchart form, a method 300 for performing backside passive voltage contrast on an SOI device. In particular, method 300 may be used in conjunction with a PGA-packaged SOI device such as device 202 shown in FIG. 2. Alternatively, method 300 may be used with an unpackaged device as described further hereinbelow.

Figure 4A:
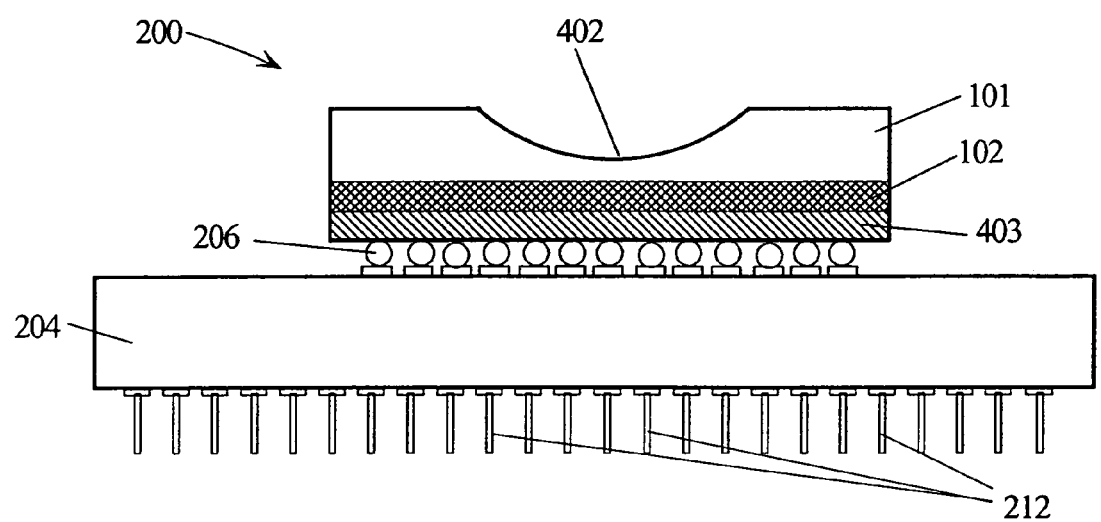
FIG. 4A illustrates an embodiment of the present invention of the SOI device after the step of grinding the substrate using a dimpling tool.

In step 302, a portion of the substrate (e.g. substrate 101, FIG. 1) is ground, to form a "dimple" in the substrate. A dimpling tool may be used to perform step 302. FIG. 4A illustrates an PGA-packaged device 200 including an SOI IC device 100 after grinding. IC 100 includes a dimpled substrate 101 including dimpled surface 402 and box insulator 102. (It would be understood by those of ordinary skill in the art that circuit 403 includes body 103 and structures disposed therein and the metal interconnects as shown in FIG. 1 and which are not shown in FIGS. 4A and 4B).

Figure 4B:
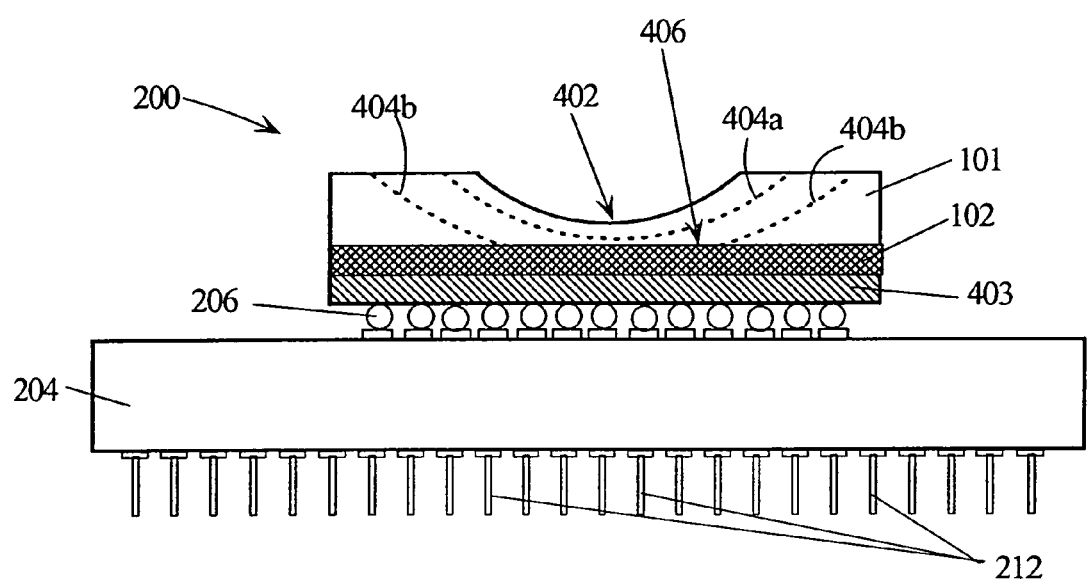
FIG. 4B illustrates an embodiment of the present invention of the SOI device during the TMAH etch.

Referring again to FIG. 3, in step 304, the dimpled substrate is etched with tetramethylammonium hydroxide (TMAH). The etch step may preferentially etch the dimpled surface portion 402, FIG. 4A. FIG. 4B illustrates SOI device 100 during the etching step, with dimpled surface 402, etched surface 404 at an intermediate stage of the etching step (404a) and etched surface 404 at an end of the etching step (404b). The etching by TMAH may stop at box insulator 102 as TMAH does not etch oxide material, thereby exposing a backside surface 406 of the box insulator. In other words, the exposed backside surface is defined by the dimpling and etching steps.

Figure 4C:
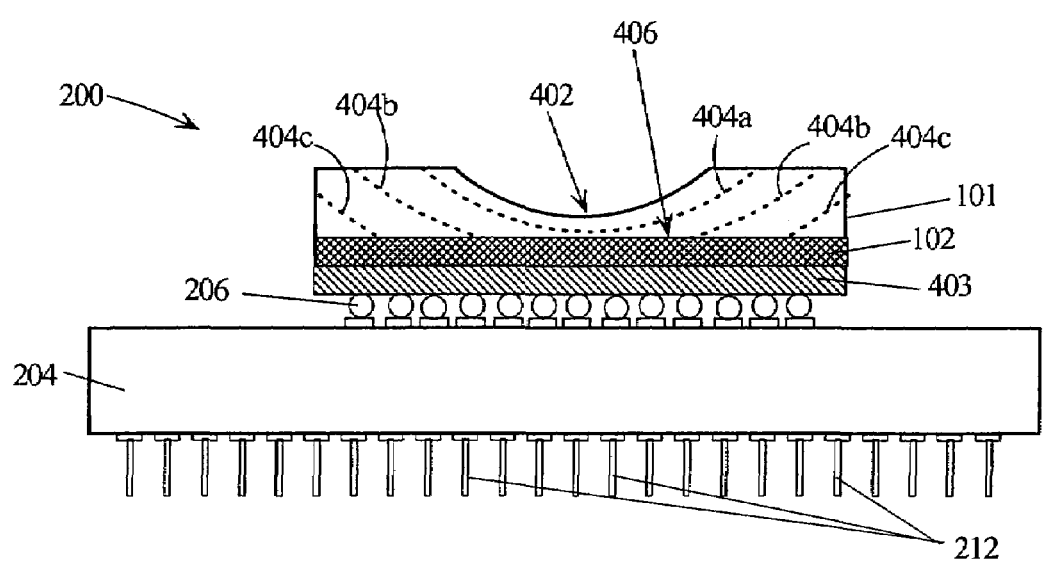
FIG. 4C illustrates an embodiment of the present invention of the SOI device during an optional HF acid etch.

Box oxide may optionally be removed. If, in step 306, box oxide is to be removed, in step 308 a portion of the substrate 101 and a portion box insulator 102 are etched using hydrofluoric (HF) acid. In one embodiment, the HF acid may etch box insulator 102 up to the border with body 103 but not including body 103 as illustrated in FIG. 4C. Referring to FIG. 4C, FIG. 4C illustrates an embodiment of the present invention of SOI device 100 in which a portion of substrate 101 and a portion of box insulator 102 have been etched by HF acid at the end of the etching step (404c). Etching using HF acid may require careful attention as etching using HF acid for too long a time may cause an interaction with body 103. If box oxide material is not to be removed, the HF etch step is eliminated.

Figure 5:
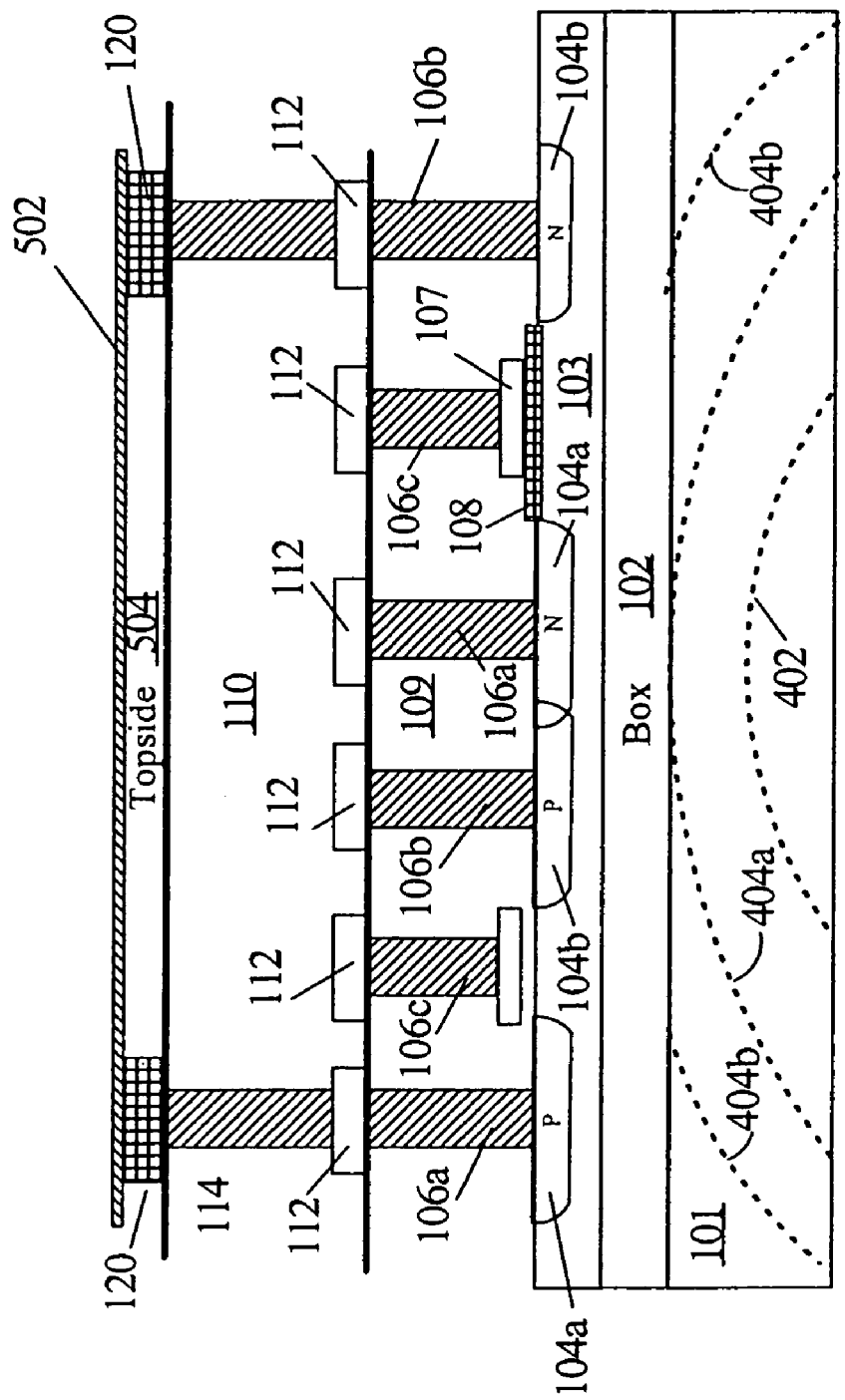
FIG. 5 is a cross-sectional view of a silicon on insulator semiconductor illustrating device preparation for backside voltage contrast inspection in accordance with the present inventive principles.

As noted above, the present inventive principles may be used in conjunction with unpackaged devices. If, in step 312, the device is not packaged, in step 314, a conductive coating, such as carbon ink, is applied to the topside surface, for example surface 208, FIG. 2. This may be further understood by referring to FIG. 5 illustrating an SOI device 100 after the TMAH etch step discussed above. Carbon ink layer 502 is disposed on topside insulator 504 and metal-layer 120. This provides a conducting path between metal-2 layer 120, step 316 and the body 103. (Reference numerals not explicitly referred to correspond to structures described in conjunction with FIG. 1.)

If, alternatively, in step 312, the device is packaged, the pins of the PGA are grounded, step 318.

Figure 6:
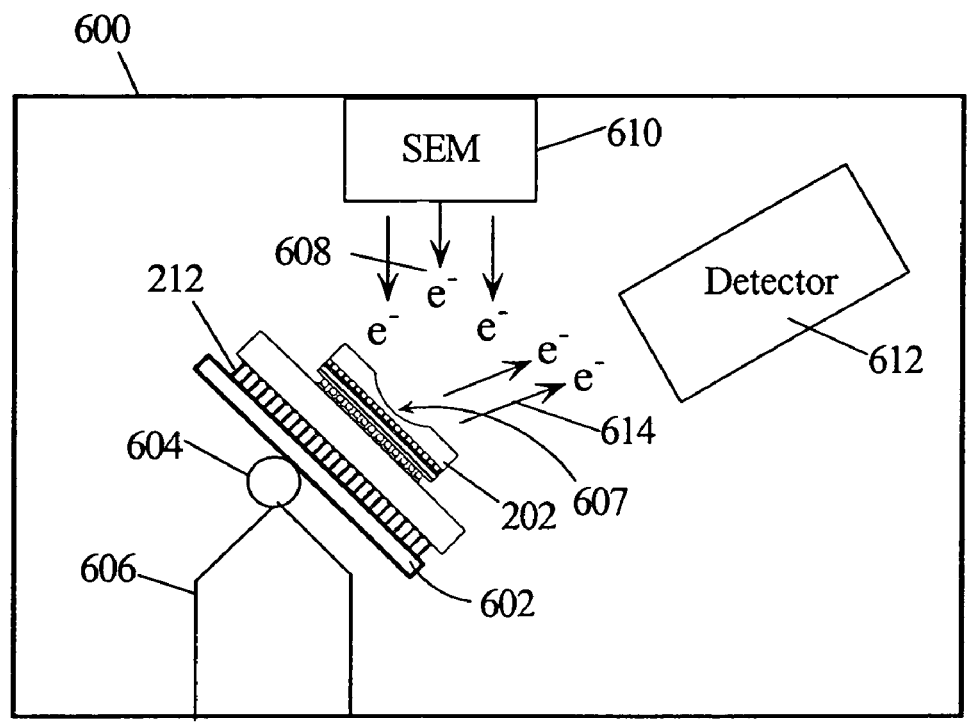
FIG. 6 an embodiment of the present invention of a passive voltage contrast chamber used for backside voltage contrast on an SOI device.

In step 320, a charged particle beam is directed onto the backside surface of the device, as illustrated in FIG. 6.

FIG. 6 depicts an embodiment of the present invention of a passive voltage contrast chamber 600. It would be appreciated by those of ordinary skill in the art that the interior of chamber 600 is under vacuum. The passive voltage contrast technique may involve attaching PGA-packaged SOI device 202 to a rotating stage 602 in chamber 600. Pins 212 of the PGA package may be electrically connected to ground (not shown in FIG. 6). Rotating stage 602 may include a support member 604 and a pivoting mechanism 606. Once device 202 has been rotated into the appropriate location to expose backside surface 607 to a charged particle beam such as electron beam 608 from SEM 610. Note that, in an embodiment in which the HF etch step (optional step 308, FIG. 3) is not used, the energy of the electron beam may be selected to penetrate the box oxide and expose the structures within body 103. For example, energies in the range of 5 keV to 20 keV may be used. It would be appreciated by those of ordinary skill in the art that the beam energies depend on the parameters of the box layer, such as thickness and composition, and that these energies are exemplary, and that other beam energies may be used in conjunction with alternative embodiments of the present invention, and such alternative embodiments would be within the spirit and scope of the present invention.

A detector 612 may be configured to detect any secondary electrons 614 that may be emitted. For example, p-type active regions absorb more electrons (emit more secondary electrons), and thus appear "bright" while n-type active regions absorb fewer electrons (emit fewer secondary electrons), and appear "dark." Consequently, by observing the regions of secondary emission (step 322, FIG. 3) with detector 612, the boundaries of the active regions within body 103 (FIG. 1), may be inspected, for example.

What is claimed is:

1. A method for performing passive voltage contrast on a silicon on insulator (SOI) device comprising the steps of:
    grinding a first portion of a substrate of said SOI device with a dimpling tool;
    etching a second portion of said substrate of said SOI device with tetramethylammonium hydroxide (TMAH) following said grinding of said SOI device with said dimpling tool; and
    directing a beam of electrons at a backside surface of said SOI device.

2. The method of claim 1, wherein said beam of electrons is operable for generating a secondary emission of electrons one or more active regions in said SOI device.

3. The method of claim 2, wherein a presence of said secondary electron emission signals determines a p-type active region, and an absence of secondary emission determines a n-type active region.

4. The method of claim 2, said secondary emission for inspecting a boundary between a first active region and a second active region of said one or more active regions in said SOI device.

5. The method of claim 1 further comprising connecting one or more pins of a pin-grid-array package containing said SOI device to a ground reference.

6. The method of claim 1 further comprising:
    applying a conductive coating to a topside surface of said SOI device; and
    connecting said conductive coating to a ground reference.

7. The method as recited in claim 1, wherein said conductive coating comprises a carbon ink coating.

8. The method of claim 1 further comprising etching a third portion of said substrate and a portion of a box insulator of said SOI device with hydrofluoric acid (HF) following said etching of said SOI device with said TMAH.

* * * * *